United States Patent
Kwon

(10) Patent No.: US 9,673,758 B2
(45) Date of Patent: Jun. 6, 2017

(54) DIFFERENTIAL AMPLIFIER CIRCUIT

(71) Applicant: SK hynix Inc., Gyeonggi-do (KR)

(72) Inventor: Kyoung-Han Kwon, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/963,904

(22) Filed: Dec. 9, 2015

(65) Prior Publication Data

US 2016/0373066 A1    Dec. 22, 2016

(30) Foreign Application Priority Data

Jun. 22, 2015 (KR) .................. 10-2015-0088142

(51) Int. Cl.
*H03F 3/45* (2006.01)
*H03F 3/72* (2006.01)
*H03F 1/02* (2006.01)

(52) U.S. Cl.
CPC ....... *H03F 1/0205* (2013.01); *H03F 3/45264* (2013.01); *H03F 3/45269* (2013.01); *H03F 2203/45091* (2013.01)

(58) Field of Classification Search
CPC ................. H03F 3/45; H03F 1/14; H03F 3/72
USPC .................................................... 330/51, 253
See application file for complete search history.

(56) References Cited

U.S. PATENT DOCUMENTS 5,426,396 A * 6/1995 Bee ........................... H03F 3/72
                                                         327/408
8,928,357 B1    1/2015 El-Mansouri et al.

FOREIGN PATENT DOCUMENTS

KR    1020130140418    12/2013

OTHER PUBLICATIONS

Tsuguo Kobayashi et al., "A current-controlled latch sense amplifier and a static power-saving input buffer for love-power architecture", IEEE Journal of Solid-State Circuits, Apr. 1993, p. 523-527, vol. 28, No. 4.

* cited by examiner

*Primary Examiner* — Steven J Mottola
(74) *Attorney, Agent, or Firm* — IP & T Group LLP

(57) ABSTRACT

A differential amplification circuit may include a differential amplification unit including a first input transistor and a second input transistor, and suitable for differentially amplifying input signals inputted through the first and second input transistors; a first input control section suitable for turning off the first input transistor when the differential amplification circuit is disabled and transferring a first input signal to the first input transistor when the differential amplification circuit is enabled; and a second input control section suitable for turning off the second input transistor when the differential amplification circuit is disabled and transferring a second input signal to the second input transistor when the differential amplification circuit is enabled.

10 Claims, 3 Drawing Sheets

DIFFERENTIAL AMPLIFIER CIRCUIT

CROSS-REFERENCE TO RELATED APPLICATIONS

The present application claims priority of Korean Patent Application No. 10-2015-0088142, filed on Jun. 22, 2015, which is incorporated herein by reference in its entirety.

BACKGROUND

1. Field

Exemplary embodiments of the present invention relate to a differential amplifier circuit that amplifies a differential signal.

2. Description of the Related Art

Differential amplifier circuits amplify a voltage difference between input, signals to generate output signals. The differential amplifier circuits are used in most integrated circuit chips.

FIG. 1 is a diagram illustrating a conventional differential amplifier circuit.

Referring to FIG. 1, the differential amplifier circuit includes a differential amplification unit 110 and an enable transistor 120.

The differential amplification unit 110 amplifies a voltage difference between input signals IN and INB to generate output signals OUT and OUTB. When the input signal IN has a voltage that is higher than that of the input signal INB, the output signal OUT is generated with a logic high level and the output signal OUTB is generated with a logic low level. Furthermore, when the input signal NB has a voltage higher than that of the input signal IN, the output signal OUT is generated with a logic low level and the output signal OUTB is generated with a logic high level.

The enable transistor 120 allows a current to flow through the differential amplification unit 110 such that the differential amplification unit 110 is enabled when an enable signal EN is activated, and substantially prevents a current from flowing through the differential amplification unit 110 such that the differential amplification unit 110 is disabled when the enable signal EN is deactivated. A high amount of current is consumed in the operations of the differential amplification unit 110, but the enable transistor 120 disables the differential amplification unit 110 when the amplification operation of the differential amplification unit 110 is not required, so that it is possible to reduce unnecessary current consumption.

The enable transistor 120 substantially prevents unnecessary current consumption by enabling/disabling the differentia amplification unit 110, but the enable transistor 120 is serially coupled to elements in the differential amplification unit 110, so that current consumption of the differential amplification unit 110 may increase and the operation speed of the differential amplification unit 110 may be reduced by the enable transistor 120.

SUMMARY

Various embodiments are directed to a differential, amplifier circuit that operates at a high speed with low current consumption.

In an embodiment, a differential amplification circuit may include a differential amplification unit including a first input transistor and a second input transistor, and suitable for differentially amplifying input signals inputted through the first and second input transistors; a first input control section suitable for turning off the first input transistor when the differential amplification circuit is disabled and transferring a first input signal to the first input transistor when the differential amplification circuit is enabled; and a second input control section suitable for turning off the second input transistor when the differential amplification circuit is disabled and transferring a second input signal to the second input transistor when the differential amplification circuit is enabled.

In an embodiment, a differential amplification circuit may include a differential amplification unit including a first input node and a second input node, and suitable for differentially amplifying signals inputted through the first and second input nodes; and an enable control unit suitable for transferring a first input signal and a second input signal to the first input node and the second input node, respectively, when the differential amplifier circuit is enabled, and controlling the first and second input nodes such that no current flows through the differential amplification unit when the differential amplifier circuit is disabled.

In an embodiment, a differential amplification circuit may include: a differential amplification unit including a first and a second input transistor; a first enable control transistor suitable for transferring a voltage that turns off the first input transistor to a gate of the first input transistor; a second enable control transistor suitable for transferring a first input signal to the gate of the first input transistor; a third enable control transistor suitable for transferring a voltage that turns off the second input transistor to a gate of the second input transistor; and a fourth enable control transistor suitable for transferring a second input signal to the gate of the second input transistor.

DETAILED DESCRIPTION

Figure 1:
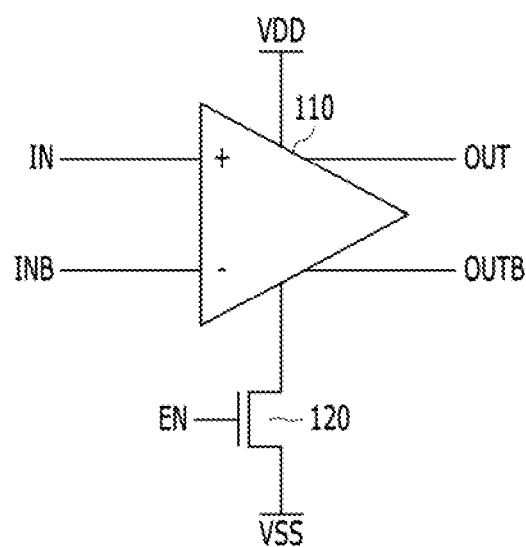
FIG. 1 is a diagram illustrating a conventional differential amplifier circuit.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated to clearly illustrate features of the embodiments. It is also noted that in this specification, "connected/coupled" refers to one component not only directly coupling another component, but also indirectly coupling another component through an intermediate component. In addition, a singular form may include a plural form as long as it is not specifically mentioned.

Figure 2:
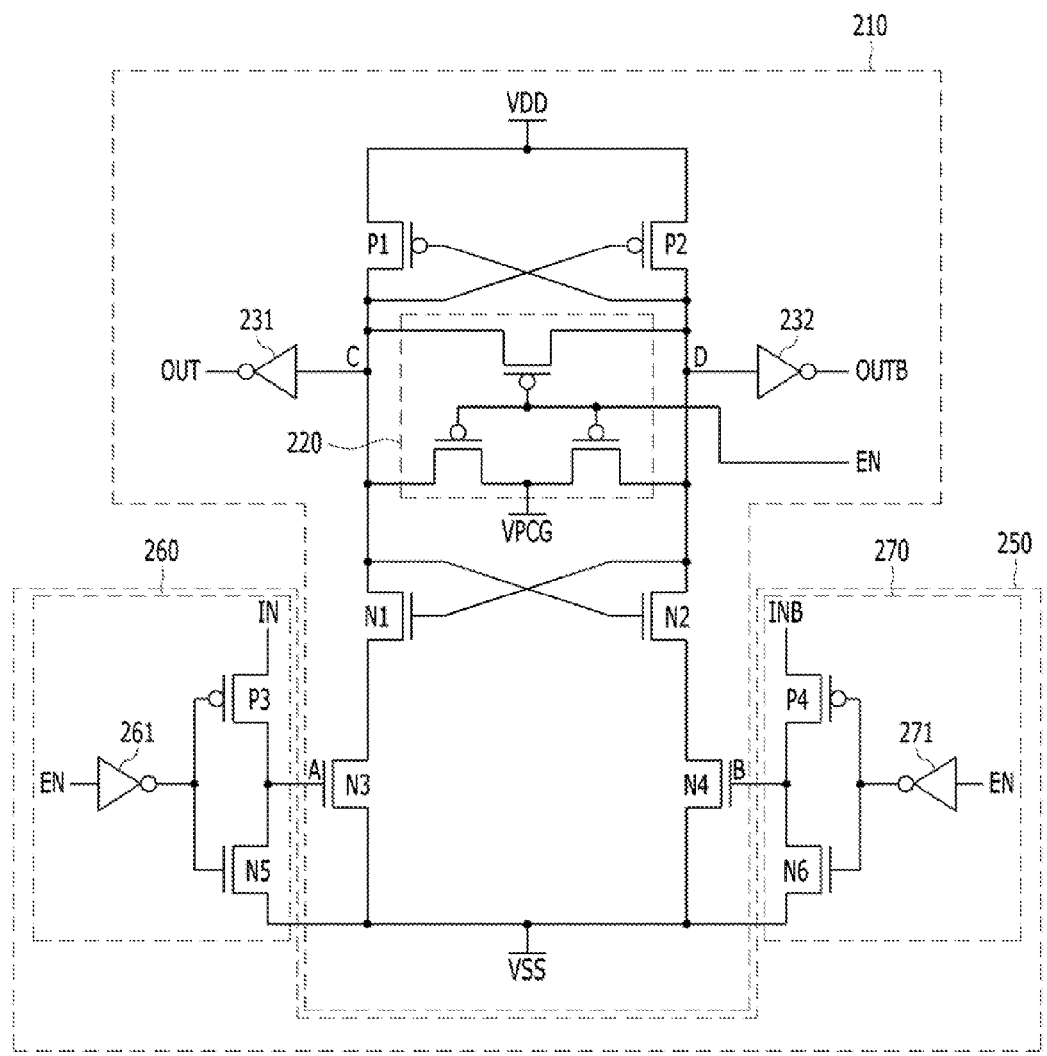
FIG. 2 is diagram illustrating a differential amplifier circuit according to an embodiment of the present invention.

FIG. 2 is a diagram illustrating a differential amplifier circuit according to an embodiment of the present invention.

Referring to FIG. 2, the differential amplifier circuit may include a differential amplification unit 210 and an enable control unit 250.

The differential amplification unit 210 may differentially amplify voltages of first and second input nodes A and B to generate first and second output signals OUT and OUTB. When the first input node A has a voltage higher than that of the second input node B, the first output signal OUT may be generated with a logic high level and the second output signal OUTB may be generated with a logic low level. Furthermore, when the second input node B has a voltage higher than that of the first input node A, the first output signal OUT may be generated with a logic low level and the second output signal OUTB may be generated with a logic high level. The differential amplification unit 210 may include a first input transistor N3, a second input transistor N4, two cross-coupled inverters P1/N1 and P2/N2, a precharge section 220, and inverters 231 and 232 for outputting the first and second output signals OUT and OUTB.

The first input transistor N3 is a transistor for receiving a signal of the first input node A and the second input transistor N4 is a transistor for receiving a signal of the second input node B. FIG. 2 illustrates that the first input transistor N3 and the second input transistor N4 are NMOS transistors.

The two cross-coupled inverters P1/N1 and P2/N2 may amplify a voltage difference between the first input node A and the second input node B. The PMOS transistor P1 and the NMOS transistor N1 may form one inverter and the PMOS transistor P2 and the NMOS transistor N2 may form one inverter. The two inverters P1/N1 and P2/N2 may be cross-coupled, that is, may be coupled in a latch type to differentially amplify a voltage difference between input signals IN and INB. By the two cross-coupled inverters, voltages of nodes C and D are differentially amplified, and the amplified voltages of the nodes C and D may be outputted as the first output signal OUT and the second output signal OUTB through the inverters 231 and 232.

The precharge section 220 may precharge the nodes C and D to the same level of a precharge voltage VPCG when an enable signal EN is deactivated. Preferably, the precharge voltage VPCG has an intermediate level of a power supply voltage VDD and a ground voltage VSS (i.e., VDD/2), but it may also have other levels. The enable signal EN is for enabling/disabling the differential amplifier circuit, and may have a logic high level when the differential amplifier circuit is to be enabled and may have a logic low level when the differential amplifier circuit is to be disabled.

The enable control unit 250 may respectively transfer a first input signal IN and a second input signal INB to the first input node A and the second input node B when the differential amplifier circuit is enabled, that is, when the enable signal EN is activated. Furthermore, when the differential amplifier circuit is disabled, that is, when the enable signal EN is deactivated, the enable control unit 250 may control the first input node A and the second input node B such that no current flows through the differential amplification unit 210. The enable control unit 250 may include a first input control section 260 and a second input control section 270.

The first input control section 260 may transfer the first input signal IN to the first input node A when the differential amplifier circuit is enabled, that is, when the enable signal EN is activated. Furthermore, when the differential amplifier circuit is disabled, that is, when the enable signal EN is deactivated, the first input control section 260 may transfer a voltage (e.g., a ground voltage) for turning off the first input transistor N3 to the first input node A. Accordingly, when the enable signal EN is deactivated, a current path through the first input transistor N3 may be blocked. The first input control section 260 may include an inverter 261, a PMOS transistor P3, and a NMOS transistor N.

The second input control section 270 may transfer the second input signal INB to the second input node B when the differential amplifier circuit is enabled, that is, when the enable signal EN is activated. Furthermore, when the differential amplifier circuit is disabled, that is, when the enable signal EN is deactivated, the second input control section 270 may transfer a voltage (e.g., a ground voltage) for turning off the second input transistor N4 to the second input node B. Accordingly, when the enable signal EN is deactivated, a current path through the second input transistor N4 may be blocked. The second input control section 270 may include an inverter 271, a PMOS transistor P4, and a NMOS transistor N6.

When the enable signal EN is activated, the first input control section 260 and the second input control section 270 transfer the first input signal IN and the second input signal INB to the first input node A and the second input node B, respectively, so that the differential amplification unit 210 may differentially amplify the first input signal IN and the second input signal INB. When the enable signal EN is deactivated, the first input control section 260 and the second input control section 270 turn off the first input transistor N3 and the second input transistor N4. Thus, no current flows through the differential amplification unit 210, so that the differential amplification unit 210 may be disabled. Since the first input control section 260 and the second input control section 270 disable the differential amplification unit 210 and include no elements serially coupled to elements of the differential amplification unit 210, an operation current of the differential amplification unit 210 is not increased and an operation speed of the differential amplification unit 210 is not reduced.

Figure 3:
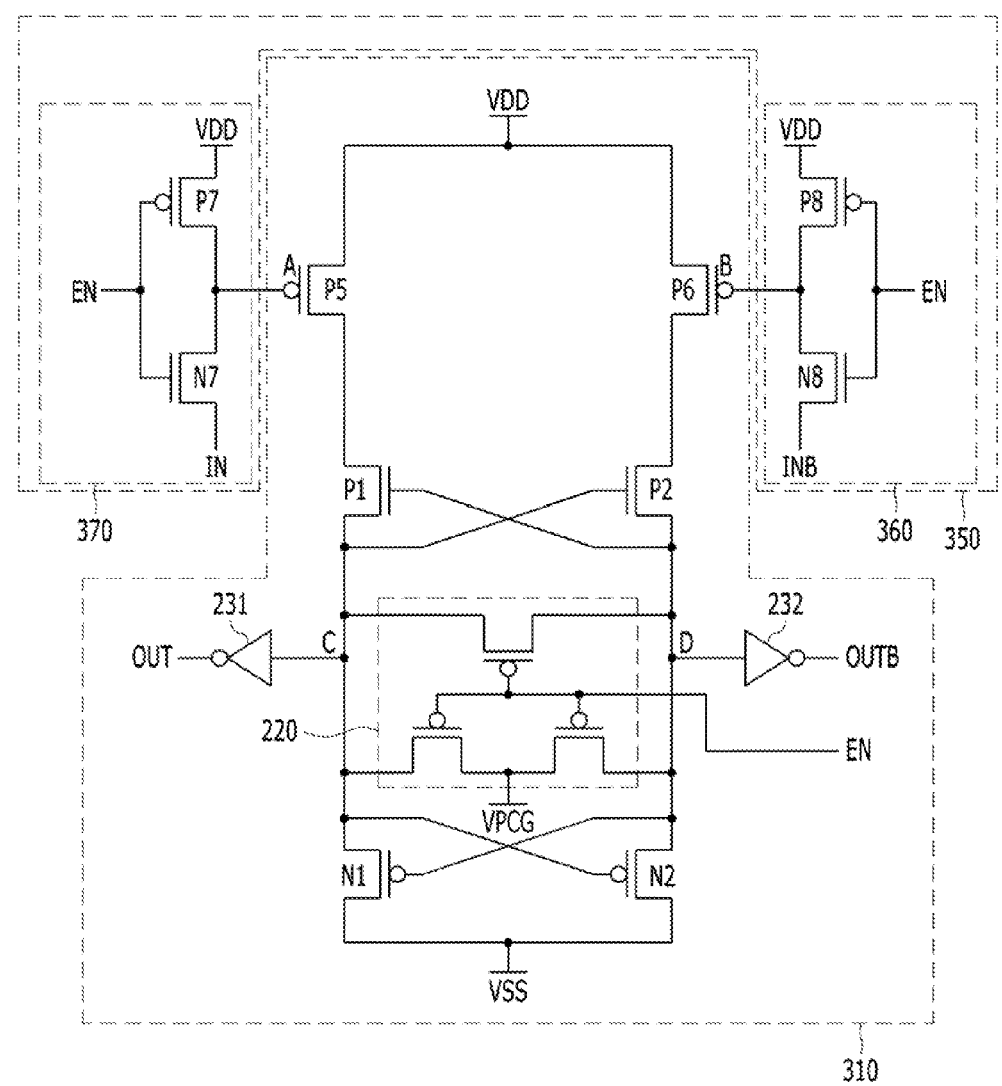
FIG. 3 is a diagram illustrating a differential amplifier circuit according to an embodiment of the present invention.

FIG. 3 is a diagram illustrating a differential amplifier circuit according to an embodiment of the present invention.

With reference to FIG. 3, the case in which input transistors P5 and P6 of a differential amplification unit 310 are PMOS transistors will be described. Referring to FIG. 3, the differential amplification unit 310 may include a differential amplification unit 310 and an enable control unit 350.

The differential amplification unit 310 may differentially amplify voltages of first and second input nodes A and B to generate first and second output signals OUT and OUTB. When the first input node A has a voltage higher than that of the second input node B, the first output signal OUT may be generated with a logic high level and the second output signal OUTB may be generated with a logic low level. Furthermore, when the second input node B has a voltage higher than that of the first input node A, the first output signal OUT may be generated with a logic low level and the second output signal OUTB may be generated with a logic high level. The differential amplification unit 310 may include a first input transistor P5, a second input transistor P6, two cross-coupled inverters P1/N1 and P2/N2, a precharge section 220, and inverters 231 and 232 for outputting the first and second output signals OUT and OUTB. The differential amplification unit 310 may operate in a similar scheme to the differential amplification unit 210 except that the first input transistor P5 and the second input transistor P6 have been changed to PMOS transistors.

The enable control unit 350 may respectively transfer a first input signal IN and a second input signal INB to the first input node A and the second input node B when the differential amplifier circuit is enabled, that is, when the enable signal EN is activated. Furthermore, when the differential amplifier circuit is disabled, that is, when the enable signal EN is deactivated, the enable control unit 350 may control the first input node A and the second input node B such that no current flows through the differential amplification unit 310. The enable control unit 350 may include a first input control section 360 and a second input control section 370.

The first input control section 360 may transfer the first input signal IN to the first input node A when the differential amplifier circuit is enabled, that is, when the enable signal EN is activated. Furthermore, when the differential amplifier circuit is disabled, that is, when the enable signal EN is deactivated, the first input control section 360 may transfer a voltage (e.g., a ground voltage) for turning off the first input transistor P5 to the first input node A. Accordingly, when the enable signal EN is deactivated, a current path through the first input transistor P5 may be blocked. The first input control section 360 may include a PMOS transistor P8 and a NMOS transistor N8.

The second input control section 370 may transfer the second input signal INB to the second input node B when the differential amplifier circuit is enabled, that is, when the enable signal EN is activated. Furthermore, when the differential amplifier circuit is disabled, that is, when the enable signal EN is deactivated, the second input control section 270 may transfer a voltage (e.g., a ground voltage) for turning off the second input transistor P6 to the second input node B. Accordingly, when the enable signal EN is deactivated, a current path through the second input transistor P6 may be blocked. The second input control section 370 may include a PMOS transistor P7 and a NMOS transistor N7.

When the enable signal EN is activated, the first input control section 360 and the second input control section 370 may turn off the first input transistor P5 and the second input transistor P6, thereby substantially preventing a current from flowing through the differential amplification unit 310 and disabling the differential amplification unit 310.

Although various embodiments have been described for illustrative purposes, it will be apparent to those skilled in the art that various changes and modifications may be made without departing from the spirit and scope of the invention as defined in the following claims.

What is claimed is:

1. A differential amplification circuit comprising:
   a differential amplification unit including a first input transistor and a second input transistor, and suitable for differentially amplifying input signals inputted through the first and second input transistors;
   a first input control section suitable for turning off the first input transistor when the differential amplification circuit is disabled and transferring a first input signal to the first input transistor when the differential amplification circuit is enabled; and
   a second input control section suitable for turning off the second input transistor when the differential amplification circuit is disabled and transferring a second input signal to the second input transistor when the differential amplification circuit is enabled,
   wherein the differential amplifier unit further comprises:
   two cross-coupled inverters suitable for differentially amplifying the signals inputted through the first and second input transistors.

2. The differential amplification circuit of claim 1, wherein each of the first and second input transistors is an NMOS transistor, and
   the first and second input control sections apply a voltage corresponding to a logic low level to the first and second input transistors when the differential amplification circuit is disabled.

3. The differential amplification circuit of claim 1, wherein each of the first and second input transistors is a PMOS transistor, and
   the first and second input control sections apply voltage corresponding to a logic high level to the first and second input transistors when the differential amplification circuit is disabled.

4. The differential amplification circuit of claim 1, wherein the differential amplification unit further comprises:
   a precharge section suitable for precharging output terminals of the differential amplification unit to have the same level when the differential amplification circuit is disabled.

5. A differential amplification circuit comprising:
   a differential amplification unit including a first input node and a second input node, and suitable for differentially amplifying signals inputted through the first and second input nodes; and
   an enable control unit suitable for transferring a first input signal and a second input signal to the first input node and the second input node, respectively, when the differential amplifier circuit is enabled, and controlling the first and second input nodes such that no current flows through the differential amplification unit when the differential amplifier circuit is disabled,
   wherein the differential amplification unit further comprises:
   two cross-coupled inverters suitable for differentially amplifying the signals inputted through the first and second input transistors.

6. The differential amplification circuit of claim 5, wherein the differential amplification unit comprises:
   a first input transistor having a gate coupled to the first input node; and
   a second input transistor having a gate coupled to the second input node.

7. The differential amplification circuit of claim 6, wherein each of the first and second input transistors is an NMOS transistor, and
   the enable control unit applies a voltage corresponding to a logic low level to the first and second input nodes when the differential amplification circuit is disabled.

8. The differential amplification circuit of claim 6, wherein each of the first and second input transistors is a PMOS transistor, and
   the enable control unit applies a voltage corresponding to a logic high level to the first and second input nodes when the differential amplification circuit is disabled.

9. The differential amplification circuit of claim 5, wherein the differential amplification unit further comprises:
   a precharge section suitable for precharging output nodes of the differential amplification unit to have the same level when the differential amplification circuit is disabled.

10. A differential amplification circuit comprising:
    a differential amplification unit including a first and a second input transistor;
    a first enable control transistor suitable for transferring a voltage that turns off the first input transistor to a gate of the first input transistor;
    a second enable control transistor suitable for transferring a first input signal to the gate of the first input transistor;

a third enable control transistor suitable for transferring a voltage that turns off the second input transistor to a gate of the second input transistor; and
a fourth enable control transistor suitable for transferring a second input signal to the gate of the second input transistor,
wherein the differential amplification unit further comprises:
a precharge section suitable for precharging output terminals of the differential amplification unit to have the same level when the differential amplification circuit is disabled.

* * * * *